United States Patent [19]
Silver et al.

[11] Patent Number: 5,311,020
[45] Date of Patent: May 10, 1994

[54] MONOLITHICALLY-INTEGRATED SEMICONDUCTOR/SUPERCONDUCTOR INFRARED DETECTOR AND READOUT CIRCUIT

[75] Inventors: Arnold H. Silver; Hugo W. Chan, both of Rancho Palos Verdes; Bruce J. Dalrymple, Redondo Beach; Szutsun S. Ou, Manhattan Beach; Eugene L. Dines, Lawndale; Susanne L. Thomasson, Redondo Beach, all of Calif.

[73] Assignee: TRW Inc., Redondo Beach, Calif.

[21] Appl. No.: 971,502

[22] Filed: Nov. 4, 1992

[51] Int. Cl.$^5$ ...................... H01L 39/22; H01L 31/00
[52] U.S. Cl. ............................ 250/338.4; 250/370.01; 250/370.14; 257/25; 257/31
[58] Field of Search ...................... 505/848, 849; 250/336.1, 336.2, 338.4, 370.01, 370.12, 370.13, 370.14; 257/25, 31

[56] References Cited

U.S. PATENT DOCUMENTS 4,982,080  1/1991  Wilson et al. ................ 250/336.2 X
5,121,181  6/1992  Smith, III et al. ............. 257/25 X

OTHER PUBLICATIONS

E. L. Dines et al., "Application of Superconductive Electronics to LWIR Sensor Systems," SPIE vol. 1243, Electron Image Tubes and Image Intesifiers, 1990, pp. 221-238.

S. B. Stetson et al., "Design and Performance of Blocked-Impurity-Band Detector Focal Plane Arrays," SPIE vol. 686, Infrared Detectors, Sensors and Focal Plane Arrays, Aug. 1986, pp. 48-65.

*Primary Examiner*—Constantine Hannaher
*Assistant Examiner*—Edward J. Glick
*Attorney, Agent, or Firm*—Sol L. Goldstein

[57] ABSTRACT

A monolithically-integrated semiconductor/ superconductor infrared detector and readout circuit providing sensitive, low-noise detection of infrared radiation for high-performance focal plane array applications. The infrared detector and readout circuit includes a semiconductor infrared detector and a semiconductor/superconductor transimpedance readout amplifier fabricated directly on the infrared detector using thin-film, integrated-circuit processing techniques. A superconducting analog-to-digital (A/D) converter digitizes the detector signals in the cryogenically cooled environment of the detector before coupling the signals to the much warmer and electromagnetically noisier environment of the back-end signal processing electronics, thus reducing noise contamination.

10 Claims, 2 Drawing Sheets

MONOLITHICALLY-INTEGRATED SEMICONDUCTOR/SUPERCONDUCTOR INFRARED DETECTOR AND READOUT CIRCUIT

BACKGROUND OF THE INVENTION

This invention relates generally to semiconductor infrared detectors and, more particularly, to cryogenically-cooled focal plane arrays of semiconductor infrared detectors.

Semiconductor infrared detectors are commonly arranged in focal plane arrays and cryogenically cooled to very low temperatures to provide sensitive detection of infrared radiation for various types of space-based infrared sensor systems. Cooling these infrared detector arrays to very low temperatures is particularly important for highly sensitive detection of infrared radiation in the longer wavelength, or far infrared, portion of the spectrum, especially under low background conditions. However, low-temperature infrared detector arrays generate very small analog signals which are easily contaminated by noise when coupled to the much warmer and electromagnetically noisier environment of the back-end signal processing electronics.

One common type of infrared sensor system utilizes bump bonding to connect a semiconductor infrared detector array to a semiconductor multiplexer array. The multiplexer array provides a readout of the analog detector signals and couples these signals, through a large number of signal leads, to the back-end signal processing electronics. Although the detector and multiplexer arrays operate together in the same cryogenically cooled environment, they are fabricated as separate electronic components because of their different and incompatible fabrication processes. This allows the detector and multiplexer arrays to be individually optimized for specific applications, but the use of bump bonding and a large number of signal leads causes added noise contamination of the small analog detector signals. Accordingly, there has been a need for a sensitive, low-noise infrared detector and readout circuit for low-temperature focal plane array applications. The present invention clearly fulfills this need.

SUMMARY OF THE INVENTION

The present invention resides in a monolithically-integrated semiconductor/superconductor infrared detector and readout circuit providing sensitive, lownoise detection of infrared radiation for high-performance focal plane array applications. The infrared detector and readout circuit includes a semiconductor infrared detector and a semiconductor/superconductor transimpedance readout amplifier fabricated directly on the infrared detector using thin-film, integrated-circuit processing techniques. This eliminates bump bonding and the resultant noise contamination. A superconducting analog-to-digital (A/D) converter digitizes the detector signals in the cryogenically cooled environment of the detector before coupling the signals to the much warmer and electromagnetically noisier environment of the back-end signal processing electronics, thus further reducing noise contamination.

In one preferred embodiment of the present invention, the semiconductor infrared detector is a blocked-impurity-band (BIB) infrared detector and the transimpedance readout amplifier includes either a metal-insulator-semiconductor (MIS) barrier diode or a metal-insulator-metal (MIM) barrier diode. In another preferred embodiment of the present invention, the semiconductor infrared detector/barrier diode is a double-barrier resonant tunneling diode.

It will be appreciated from the foregoing that the present invention represents a significant advance in the field of infrared detector arrays. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 1:
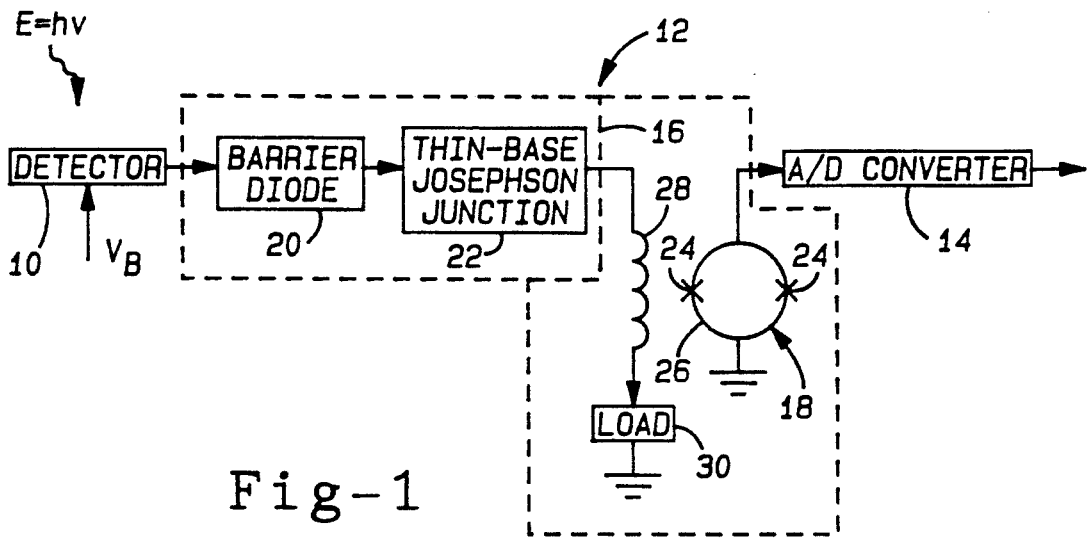
FIG. 1 is a schematic diagram of the semiconductor/superconductor infrared detector and readout circuit of the present invention.

As shown in the drawings for purposes of illustration, the present invention is embodied in a monolithically-integrated semiconductor/superconductor infrared detector and readout circuit providing sensitive, low-noise detection of infrared radiation for high-performance focal plane array applications. The infrared detector and readout circuit includes a semiconductor infrared detector and a semiconductor/superconductor transimpedance readout amplifier fabricated directly on the infrared detector using thin-film, integrated-circuit processing techniques. This eliminates bump bonding and the resultant noise contamination. A superconducting analog-to-digital (A/D) converter digitizes the detector signals in the cryogenically cooled environment of the detector before coupling the signals to the much warmer and electromagnetically noisier environment of the back-end signal processing electronics, thus further reducing noise contamination.

In one preferred embodiment of the present invention, the semiconductor infrared detector is a blocked-impurity-band (BIB) infrared detector and the transimpedance readout amplifier includes either a metal-insulator-semiconductor (MIS) barrier diode or a metal-insulator-metal (MIM) barrier diode. In another preferred embodiment of the present invention, the semiconductor infrared detector/barrier diode is a double-barrier resonant tunneling diode.

As illustrated in FIG. 1, one preferred embodiment of the present invention includes a semiconductor blocked-impurity-band (BIB) infrared detector 10, a semiconductor/superconductor transimpedance readout amplifier 12 and a superconducting analog-to-digital (A/D) converter 14. The transimpedance readout amplifier 12 efficiently couples the high-impedance BIB infrared detector 10 to the low-impedance superconducting A/D converter 14 using first and second stage amplifiers 16, 18. The first stage amplifier 16 is a high-input-impedance, semiconductor/superconductor amplifier having a semiconductor barrier diode 20 connected to a thin-base superconducting Josephson tunnel junction 22. The barrier diode 20 provides the high input impedance and the Josephson junction 22 provides the gain. The second stage amplifier 18 is a high-gain superconducting quantum interference device (SQUID) amplifier having a pair of superconducting Josephson tunnel junctions 24 connected in a superconducting loop 26. The first stage amplifier 16 is inductively coupled to the second stage amplifier 18 by an inductor 28 and grounded load 30.

Figure 2:
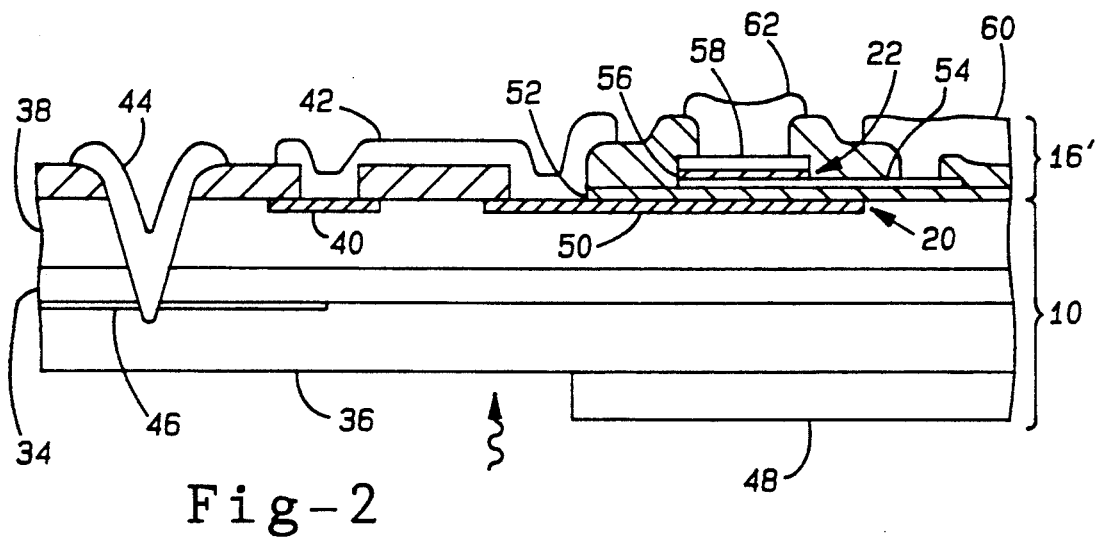
FIG. 2 is a fragmented sectional view of a monolithically-integrated blocked-impurity-band (BIB) infrared detector and a metal-insulator-semiconductor (MIS) barrier diode.
Figure 3:
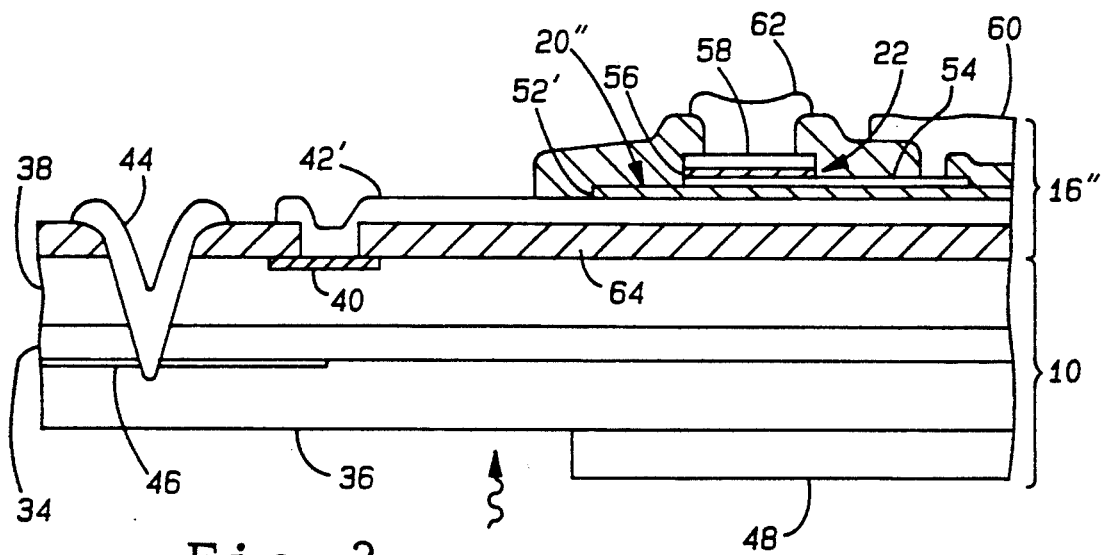
FIG. 3 is a fragmented sectional view of a monolithically-integrated BIB infrared detector and a metal-insulator-metal (MIM) barrier diode.

As illustrated in FIGS. 2 and 3, the first stage amplifier 16 includes two different embodiments 16', 16" which are monolithically integrated with the BIB infrared detector 10. The first stage amplifier 16' in FIG. 2 includes a metal-insulator-semiconductor (MIS) barrier diode 20' and the first stage amplifier 16" in FIG. 3 includes a metal-insulator-metal (MIM) barrier diode 20". The barrier diode 20 can also be a metal-lightly doped semiconductor-doped semiconductor (MOTT) barrier diode (not shown).

As illustrated in FIGS. 2 and 3, the BIB infrared detector 10 is formed by epitaxially growing a heavily n-doped infrared active layer 34 on the upper surface of an undoped transparent silicon substrate 36. A thin undoped blocking layer 38 is then grown on the infrared active layer 34. An ion-implanted ohmic contact layer 40 and detector contacts 42, 42' are formed on the blocking layer 38 to define the individual pixels. A via etch through the blocking layer 38 and the active layer 34 allows a common contact 44 to make electrical contact with a buried transparent contact layer 46 formed on the transparent substrate 36. The BIB detector 10 is back illuminated and the first stage amplifiers 16', 16" are shielded from direct illumination by an infrared reflective layer 48 formed on the lower surface of the substrate 36. However, a front illuminated BIB detector can also be used.

The heavily n-doped infrared active layer 34 has an unavoidable but small concentration of ionized acceptor impurities. In the absence of an applied bias, an equal concentration of ionized donor impurities is required for charge neutrality. The negative charges associated with the ionized acceptor sites are fixed, but the positive charges associated with the ionized donor sites are mobile. The mobile positive donor charges can migrate rapidly through the detector 10 when the neighboring donor sites are sufficiently close, using the mechanism of phonon-assisted tunneling. Applying a positive bias to the detector contacts 42, 42' creates an electric field that drives the positive donor charges toward the substrate 36, while the undoped blocking layer 38 prevents the injection of new positive donor charges. A region depleted of positive donor charges is created, and because the negative acceptor charges are immobile, a negative space charge is left in the depletion region. The electric field is largest in the blocking layer 38 and decreases linearly in the active layer 34 to zero. The width of the positive donor depletion region defines the active volume of the detector, as an appreciable electric field exists only in this region.

When an incident infrared photon is absorbed by a neutral donor, a mobile positive donor charge and a conduction band electron are created. The electron is swept through the blocking layer 38 and collected by the detector contacts 42, 42'. The mobile positive donor charge drifts in the other direction toward the substrate 36 and is considered to be collected upon reaching the undepleted region of the active layer 34. Because the infrared active layer 34 is depleted of positive donor charges, there are almost no empty states below the conduction band to trap electrons, so the collection efficiency of electrons is very high. Similarly, the conduction band electron concentration is virtually zero, so the collection efficiency of positive donor charges is also very high.

Silicon blocked-impurity-band detectors 10 provide high sensitivity and quantum efficiency in the longer wavelength, or far infrared, portion of the spectrum, as well as wide frequency response and low optical crosstalk. BIB detectors overcome the limitations of conventional silicon photoconductive detectors by utilizing the otherwise detrimental effect of hopping conductivity associated with impurity banding. The blocking layer 38 completely blocks the dark current without impeding the flow of current produced by photoionization of neutral impurities in the infrared active layer 34. BIB detectors do not follow the usual photoconductor model because of the blocking layer 38. The behavior of BIB detectors is closer to that of a reverse-biased photodiode, except that photoexcitation of electrons takes place between the donor impurity and the conduction band.

As shown in FIG. 2, the first stage amplifier 16' includes the metal-insulator-semiconductor (MIS) barrier diode 20' and the thin-base superconducting Josephson tunnel junction 22. The MIS barrier diode 20' and the Josephson junction 22 are formed directly on the semiconductor BIB infrared detector 10 using thin-film, integrated-circuit processing techniques. The MIS barrier diode 20' includes an $n^+$ diffusion layer 50 formed in the blocking layer 38, a barrier layer 52 and a thin superconducting layer 54, which is also the thin base electrode of the Josephson tunnel junction 22. The Josephson junction 22 includes the thin base electrode 54, a barrier layer 56 and a superconducting counter electrode 58. A base electrode contact 60 and a counter electrode contact 62 are formed on their respective electrodes 54, 58.

The electric current generated by the BIB infrared detector 10 is applied to the first stage amplifier 16' through the $n^+$ diffusion layer 50 of the MIS barrier diode 20'. The MIS barrier diode 20' generates hot electrons which are injected into the thin base electrode 54 of the Josephson tunnel junction 22. The output current of the Josephson junction 22 increases directly with this injection current. The Josephson junction 22 is biased into the voltage state at its sumgap voltage for operation in the amplification mode, thus providing high current gain of about 500.

Hot electron injection from the MIS barrier diode 20' into the thin base electrode 54 of the Josephson tunnel junction 22 alters the Cooper pair/quasiparticle balance in the base electrode. The hot electrons are injected over the MIS barrier at energy levels up to one half of a volt (500 meV), compared with 1.3 meV for the Cooper pair binding energy, which is about one half of the sumgap voltage ($Vg = 2.4$ meV) of the thinbase Josephson junction. Therefore, the hot electrons have energy levels that are much greater than the Cooper pair binding energy and each injected electron breaks up hundreds of Cooper pairs into quasiparticles. A change in the Cooper pair and quasiparticle densities is reflected in a change in the effective temperature of the electron gas and a corresponding change in the occupancy of quasiparticle states in the Josephson junction. The result is a decrease in the measured sumgap voltage $V_g$ of the Josephson junction and an increase in the normal tunneling current. Therefore, the hot electron injection modulates the Josephson junction sumgap voltage to provide a fast-response-time, nonequilibrium effect which is maximized by the thin base electrode of the Josephson junction.

The first stage amplifier 16' is inductively coupled to the second stage amplifier 18 by the inductor 28 and grounded load 30. The load 30 is preferably a second superconducting Josephson tunnel junction having the same I-V characteristics as the thin-base Josephson junction 22. The second Josephson junction provides a nonlinear load that is comparable to the impedance of the first stage amplifier 16', thus minimizing power dissipation. The SQUID second stage amplifier 18 is biased into the voltage state for operation in the amplification mode, thus providing high current gain of about 150 V/A. The voltage output of the second stage amplifier 18 is applied to the superconducting analog-to-digital (A/D) converter 14, which digitizes the small analog detector signals before coupling the signals to the much warmer and electromagnetically noisier environment of the back-end signal processing electronics.

As illustrated in FIG. 3, the other embodiment of the first stage amplifier 16" includes the metal-insulator-metal (MIM) barrier diode 20" and the thin-base superconducting Josephson tunnel junction 22. The MIM barrier diode 20" includes the detector contact 42', a barrier layer 52' and the thin superconducting layer 54, which is also the thin base electrode of the Josephson tunnel junction 22. The Josephson junction 22 includes the thin base electrode 54, the barrier layer 56 and the superconducting counter electrode 58. The base and counter electrode contacts 60, 62 are formed on their respective electrodes 54, 58. One advantage of the MIM barrier diode 20" is that it does not require an n+ diffusion layer 50, thus reducing the area of the first stage amplifier 16" and simplifying the fabrication process.

The first stage amplifiers 16', 16" are fabricated by depositing all layers in situ and then patterning the layers using conventional photolithography and reactive ion etching. The MIS barrier diode 20' is fabricated by forming the n+ diffusion layer 50 in the blocking layer 38 and then depositing the barrier layer 52 and the thin superconducting layer 54 on the n+ diffusion layer 50. The MIM barrier diode 20" is fabricated by depositing an insulating layer 64 on the blocking layer 38 and then depositing the detector contact 42', the barrier layer 52' and the thin superconducting layer 54 on the insulating layer 64. The barrier layer 52' can also be formed by thermally oxidizing the detector contact 42'. The input impedances of the MIS and MIM barrier diodes 20', 20" are dependent on the thickness and dielectric properties of the barrier layers 52, 52'.

The superconducting Josephson tunnel junction 22 is formed by depositing the barrier layer 56 and the superconducting counter electrode 58 on the thin base electrode 54. The barrier layer 56 can also be formed by thermally oxidizing the base electrode 54. The thickness of the thin base electrode 54 is preferably on the order of 150 Angstroms, such that the sumgap voltage of the thinbase Josephson tunnel junction 22 is about 2.4 meV, compared to 2.7-2.8 meV for a Josephson junction having a normal base electrode. The multilayer structure is then patterned using different masking steps to define the Josephson tunnel junction 22 and the MIS and MIM barrier diodes 20', 20". The base electrode contact 60 and the counter electrode contact 62 are then formed on their respective electrodes 54, 58.

The detector contacts 42, 42' and the electrode contacts 60, 62 are preferably aluminum and the superconducting base and counter electrodes 54, 58 are preferably low-temperature superconducting materials, such as niobium or niobium nitride. However, medium-temperature superconducting materials, such as barium-potassium-bismuth oxide, or high-temperature superconducting ceramis can be used. The medium- and high-temperature superconducting materials would provide sensitive, low-noise detection of infrared radiation in the shorter wavelength, or near infrared, portion of the spectrum, or even the visible portion of the spectrum.

Figure 4:
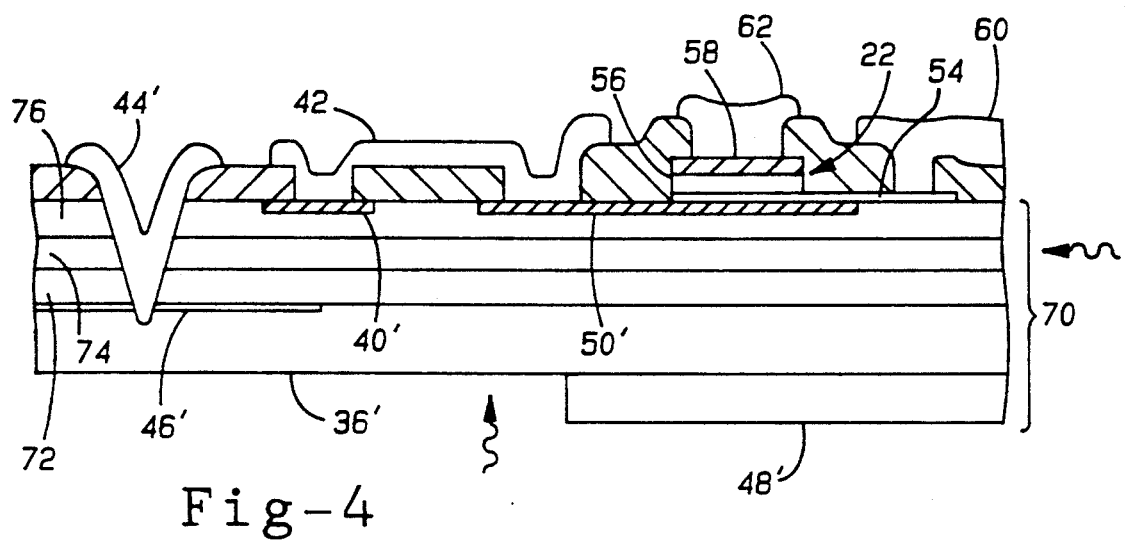
FIG. 4 is a fragmented sectional view of a double-barrier resonant tunneling diode which functions as both a detector and a barrier diode.
Figure 5:
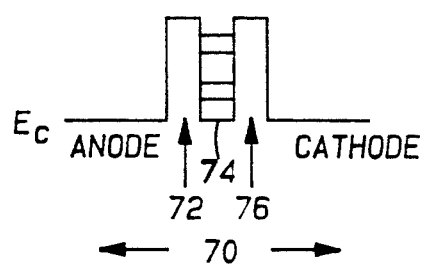
FIG. 5 is a band diagram of the double-barrier resonant tunneling diode.

As illustrated in FIG. 4, the other preferred embodiment of the present invention includes a semiconductor double-barrier resonant tunneling diode 70 in place of both the BIB infrared detector 10 and the MIS barrier diode 20' of FIG. 2. The resonant tunneling diode 70 provides sensitive, low-noise detection of radiation in the microwave and far infrared portions of the spectrum, and also functions as the barrier diode. The resonant tunneling diode 70 includes a first barrier layer 72, a quantum well layer 74 and a second barrier layer 76 formed on the upper surface of an undoped transparent semiconductor substrate 36'. An ion-implanted ohmic contact layer 40' and a detector contact 42 are formed on the second barrier layer 76 to define the individual pixels. A via etch through the barrier layers 72, 76 and the quantum well layer 74 allows a common contact 44' to make electrical contact with a buried transparent contact layer 46' formed on the transparent substrate 36'. The superconducting Josephson junction 22 is shielded from direct illumination by an infrared reflective layer 48' formed on the lower surface of the substrate 36'. The resonant tunneling diode can also be illuminated from the side. A band diagram of the resonant tunneling diode 70 is shown in FIG. 5. This figure show the conduction band diagram Ec of a typical unbiased resonant tunneling device 70 with barrier regions 72, 76 and quantum well region 74. The device is connected to the anode (substrate) on one side and to the cathode (thin-based Josephson junction based amplifier) on the other.

The thin-base Josephson junction 22 is formed directly on the resonant tunneling diode 70 using thinfilm, integrated-circuit processing techniques. An n+ diffusion layer 50' is formed in the second barrier layer 7 for ohmic contact between the resonant tunneling diode 70 and the Josephson junction 22. The Josephson junction 22 includes the thin base electrode 54, the barrier layer 56 and the superconducting counter electrode 58. The base and counter electrode contacts 60, 62 are formed on their respective electrodes 54, 58.

The resonant tunneling diode 70 provides several advantages, such as frequency tunability and low shot noise. The frequency of the resonant tunneling diode is easily tuned by changing the band gap of the barrier and quantum well layers. The quantum well restricts the energy distribution of the electrons to narrow bands, thus providing low shot noise. The barrier layers 72, 76 are preferably GaAlAs or AlAs and the quantum well layer 74 is preferably GaAs to provide good temperature stability and a large dynamic range.

The resonant tunneling diode 70 can also be used to integrate signals from two or more detectors of different spectral sensitivities, such as infrared and microwave detectors, to provide sensitive, low-noise multispectral detection. The resonant tunneling diode can also be used as a high-speed optical switch.

The semiconductor/superconductor transimpedance readout amplifier of the present invention is also useful for other applications that require impedance transformation and amplification from high-impedance, high-voltage input signals, such as that generated by semiconductor devices, to low-impedance, low-voltage output signals, such as that required by superconducting devices. Potential applications include such areas as telecommunications, imaging systems and computers.

From the foregoing, it will be appreciated that the present invention represents a significant advance in the field of infrared detector arrays. Although several preferred embodiments of the invention have been shown and described, it will be apparent that other adaptations and modifications can be made without departing from the spirit and scope of the invention. Accordingly, the invention is not to be limited, except as by the following claims.

We claim:

1. A monolithically-integrated semiconductor/superconductor infrared detector and readout circuit, comprising:
    a semiconductor blocked-impurity-band (BIB) infrared detector; and
    a semiconductor/superconductor transimpedance readout amplifier formed directly on the semiconductor BIB infrared detector using thin-film, integrated circuit processing techniques to provide sensitive, low noise detection of infrared radiation, wherein the transimpedance readout amplifier includes a metal-insulator metal (MIM) semiconductor barrier diode formed directly on the semiconductor BIB infrared detector and a thin-base superconducting Josephson tunnel junction formed on the semiconductor barrier diode.

2. The infrared detector and readout circuit as set forth in claim 1, wherein the transimpedance readout amplifier further includes a superconducting quantum interference device (SQUID) amplifier.

3. The infrared detector and readout circuit as set forth in claim 2, and further including a superconducting analog-to-digital (A/D) converter for digitizing analog detector signals output by the transimpedance readout amplifier.

4. A monolithically-integrated semiconductor/ superconductor infrared detector and readout circuit, comprising:
    a semiconductor infrared detector; and
    a semiconductor/superconductor transimpedance readout amplifier formed directly on the semiconductor infrared detector using thin-film, integrated circuit processing techniques to provide sensitive, low-noise detection of infrared radiation;
    wherein the transimpedance readout amplifier includes a metal-insulator-metal (MIM) barrier diode formed directly on the semiconductor infrared detector and a thin-base superconducting Josephson tunnel junction formed on the barrier diode.

5. The infrared detector and readout circuit as set forth in claim 4, wherein the transimpedance readout amplifier further includes a superconducting quantum interference device (SQUID) amplifier.

6. The infrared detector and readout circuit as set forth in claim 5, and further including a superconducting analog-to-digital (A/D) converter for digitizing analog detector signals output by the transimpedance readout amplifier.

7. A monolithically-integrated semiconductor/superconductor detector and readout circuit, comprising:
    a semiconductor resonant tunneling diode;
    a readout amplifier including a thin-base superconducting Josephson tunnel junction formed directly on the semiconductor resonant tunneling diode using thin-film, integrated circuit processing techniques wherein the resonant tunneling diode detects microwave and infrared radiation with high sensitivity and low noise.

8. The detector and readout circuit as set forth in claim 7, and further including a superconducting quantum interference device (SQUID) amplifier.

9. The detector and readout circuit as set forth in claim 8, and further including a superconducting analog-to-digital (A/D) converter for digitizing analog detector signals output by the SQUID amplifier.

10. The detector and readout circuit as set forth in claim 7, wherein the resonant tunneling diode is a double-barrier resonant tunneling diode.

* * * * *